United States Patent [19]
Takayama et al.

[11] 3,981,005
[45] Sept. 14, 1976

[54] TRANSMITTING APPARATUS USING A/D CONVERTER AND ANALOG SIGNAL COMPRESSION AND EXPANSION

[75] Inventors: Jun Takayama; Takenori Sonoda, both of Tokyo, Japan

[73] Assignee: Sony Corporation, Tokyo, Japan

[22] Filed: June 21, 1974

[21] Appl. No.: 481,804

[30] Foreign Application Priority Data
June 21, 1973 Japan.................. 48-70123

[52] U.S. Cl.................. 340/347 AD; 340/347 DA
[51] Int. Cl.² ........................ H03K 13/02
[58] Field of Search .. 340/347 C, 347 AD, 347 DA; 324/115, 116

[56] References Cited
UNITED STATES PATENTS

| | | | |
|---|---|---|---|
| 3,012,195 | 12/1961 | Slocomb | 340/347 AD |
| 3,133,278 | 5/1964 | Millis | 340/347 AD |
| 3,187,323 | 6/1965 | Flood | 340/347 AD |
| 3,216,003 | 11/1965 | Funk et al. | 340/347 |
| 3,313,924 | 4/1967 | Schulz | 340/347 AD |
| 3,480,948 | 11/1969 | Lord | 340/347 |
| 3,500,247 | 3/1970 | Sekimoto et al. | 340/347 AD |
| 3,516,085 | 6/1970 | Dano | 340/347 AD |
| 3,525,948 | 8/1970 | Sherer | 340/347 AD |
| 3,611,355 | 10/1971 | Hartke | 340/347 AD |
| 3,646,548 | 2/1972 | Van Doren | 340/347 AD |
| 3,696,399 | 10/1972 | Klein et al. | 340/347 AD |
| 3,735,394 | 5/1973 | Eto | 340/347 NT |

*Primary Examiner*—Charles D. Miller
*Attorney, Agent, or Firm*—Alvin Sinderbrand; Lewis H. Eslinger

[57] ABSTRACT

A signal conversion system in which an analog signal of a certain magnitude can be encoded as a digital signal making full use of the available number of bits of an A/D converter. The system includes amplitude adjustment apparatus with an up-down counter actuated by the maximum available binary value of the digital signal to count UP one step and set an amplitude selection circuit to effectively attenuate the amplitude of the analog signal by a predetermined amount. The counter may have more than one memorizable count level to control a corresponding number of amplitude selection levels. The counter counts DOWN when the most significant bit of the digital signal drops from 1 to 0. The invention includes a corresponding analog signal reconstruction circuit except that it includes a D/A converter that produces an analog signal at maximum value that must be attenuated for low-amplitude values.

11 Claims, 7 Drawing Figures

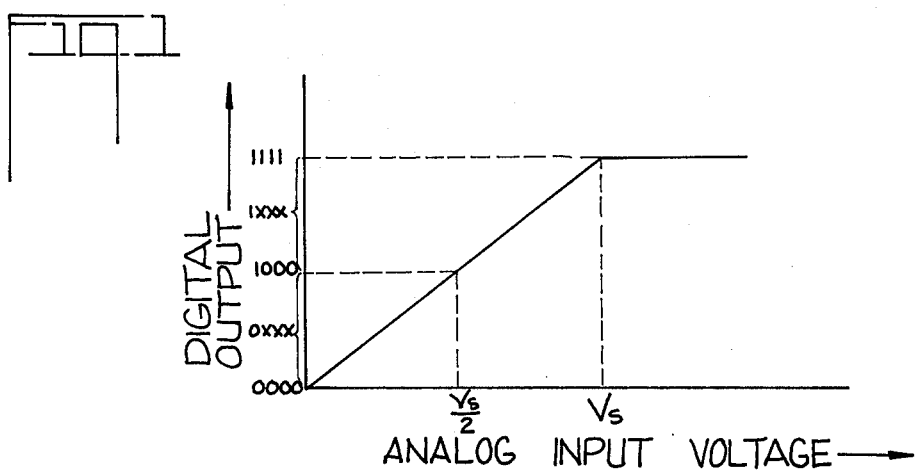
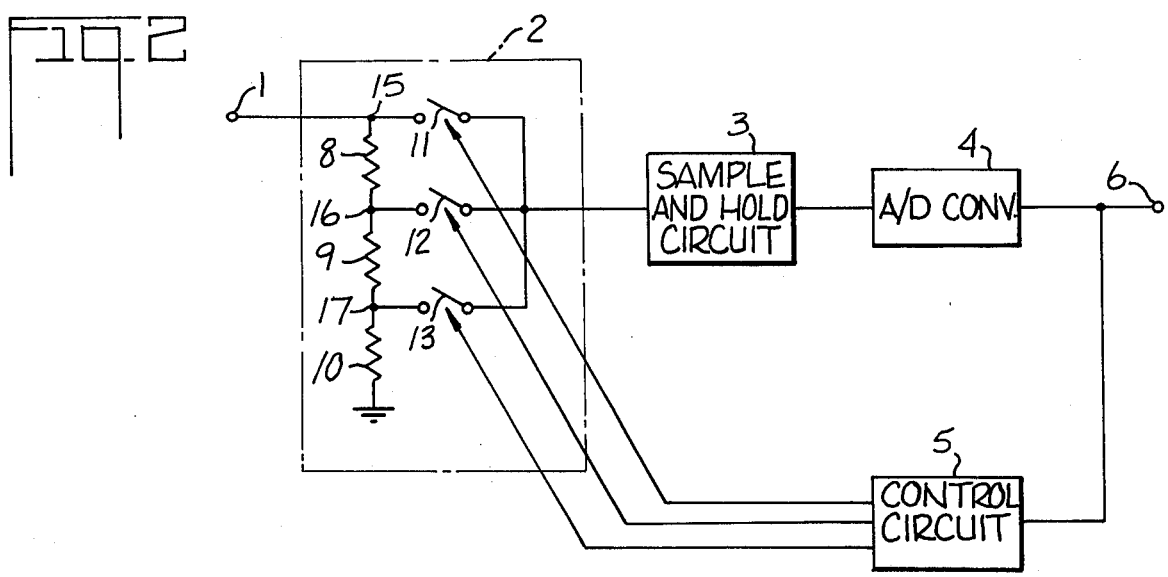
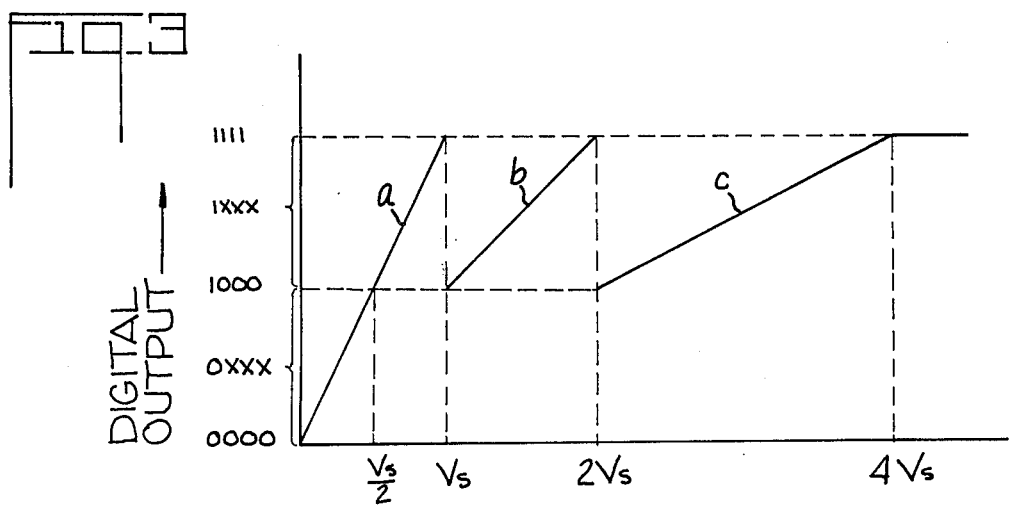

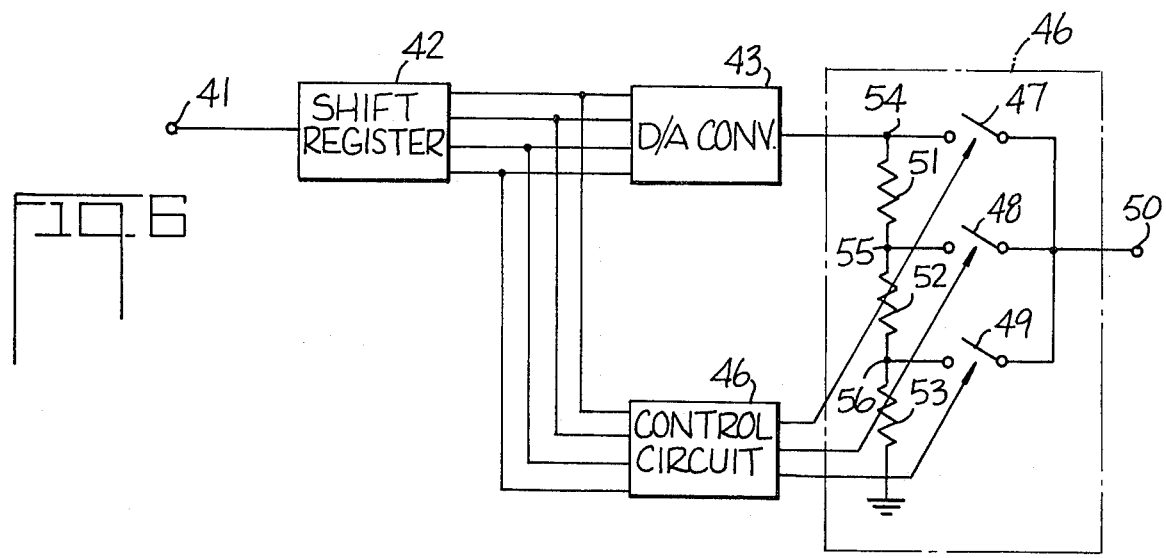
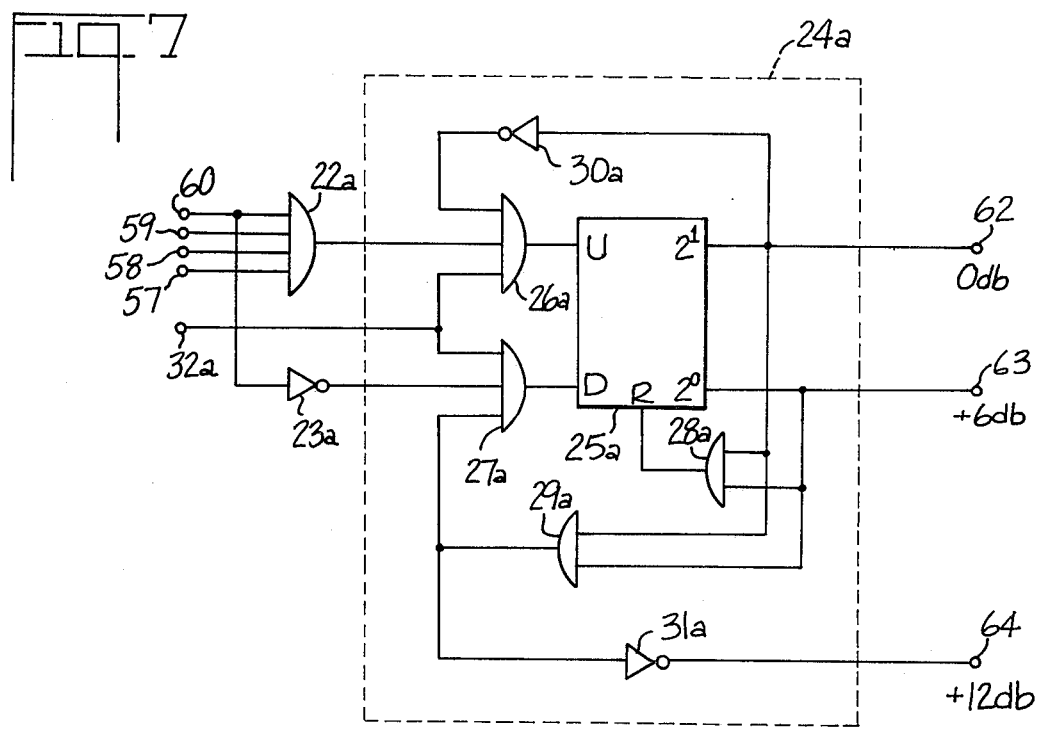

TRANSMITTING APPARATUS USING A/D CONVERTER AND ANALOG SIGNAL COMPRESSION AND EXPANSION

BACKGROUND OF THE INVENTION

1. Field of the Invention

This invention relates to a system in which analog signals are transformed into digital signals by encoding apparatus that includes an amplitude adjustment means to permit analog signals of greater amplitude to be digitally encoded. The invention further relates to transformation of the digital signals back into analog form, including transformation of properly encoded signals back to greater amplitude analog signals. In either type of transformation certain digital signals are used to control the amplitude adjustment apparatus to expand the amplitude of analog signals that may be handled without correspondingly expanding the number of digits that must be used.

2. The Prior Art

When it is desired to process analog signals by means of apparatus capable of handling only digital signals, the analog signals must be converted into digital signals. Basically, this involves selecting the number of digits that one is willing to use, and then assigning a number of levels to the analog range, each level corresponding to a digital increment. For example, if four digits are to be used, the maximum number of analog steps can be fifteen, since the decimal equivalent of the binary number 1111 is $2^4-1$, or 15. This maximum decimal value is then considered to be equal to the maximum analog signal amplitude and any signal value below that maximum corresponds to a certain digital number. For example, the first increment corresponds to the digital number 1, the second to the digital number 10, and so on.

The analog signal can be reconstructed by transforming the digital signal back into analog form. The reconstructed analog signal may not have a smooth variation from one level to the next unless it is possible to use a smoothing filter. The greater the number of increments, the more closely the waveform of the reconstructed analog signal will correspond to the original analog signal.

The actual magnitude of the analog signal does not affect the quality of the reconstructed signal; if the encoding apparatus is designed to encode an analog signal having a maximum peak value of one volt and the actual signal is 10 volts, it has been the practice heretofore to attenuate the actual signal to the acceptable value. On the other hand if the actual signal is only a fraction of a volt, the practice has been to amplify it to the desired value. In any case once the amplitude of the analog signal was adjusted so that the maximum value of the signal could be accommodated by the encoding apparatus with peak values of the analog signal using all or almost all of the available digital increments, the number of available increments was determined by the number of binary digits, and it was impossible to accommodate peaks of the analog signal that exceeded the predetermined level selected as the maximum. It would be possible to increase the number of binary digits but before doing so it is necessary to take into account the frequency range of the apparatus, such as a transmission line, through which the binary signals would have to be passed. More digits means more complex and more expensive equipment or a limitation in the frequency range of the analog signals.

It is one object of the present invention to provide conversion apparatus for use in analog-to-digital and digital-to-analog conversion systems to accommodate higher peak values of the analog signal without increasing the number of binary digits by using a pattern, or code of the binary signal to change the amplitude of the analog signal in conversion.

Further objects will become apparent from the following specification together with the drawings.

BRIEF DESCRIPTION OF THE INVENTION

In accordance with the present invention, there is provided in the analog-to-digital part of the apparatus an amplitude adjustment section that adjusts the amplitude of the analog signal to certain related ranges of values. The apparatus also includes means to detect certain digital relationships in the converted signal, and to use those relationships to control the amplitude adjustment section. Thus, when the magnitude of the original analog signal reaches a first predetermined level, as determined by a first digital signal, the effective increment of the quantizing steps in the encoding apparatus is increased, and when the magnitude of the analog signal decreases below a certain predetermined level as determined by another digital signal, the incremental value of the quantizing steps is decreased. In the digital-to-analog apparatus, when a digital signal reaches a certain predetermined value, the conversion apparatus is controlled so as to increase the magnitude of the analog signal produced from the digital signal. On the other hand, when the digital signal reaches another predetermined value, the digital-to-analog conversion apparatus is controlled to decrease the magnitude of the resulting analog signal.

BRIEF DESCRIPTION OF THE DRAWINGS

FIG. 1 is a graph showing the relationship between analog signal values and digital values in analog-to-digital converters of the prior art.

FIG. 2 is a block diagram of basic apparatus for converting analog signals to digital signals according to the present invention.

FIG. 3 is a graph illustrating the relationship between analog signal values and digital signals in accordance with the present invention.

FIG. 6 is a block diagram of a basic digital-to-analog conversion system according to the present invention.

FIG. 7 is a schematic diagram of the control circuit in the digital-to-analog conversion apparatus of FIG. 6.

DESCRIPTION OF THE PREFERRED EMBODIMENTS

Figure 4:
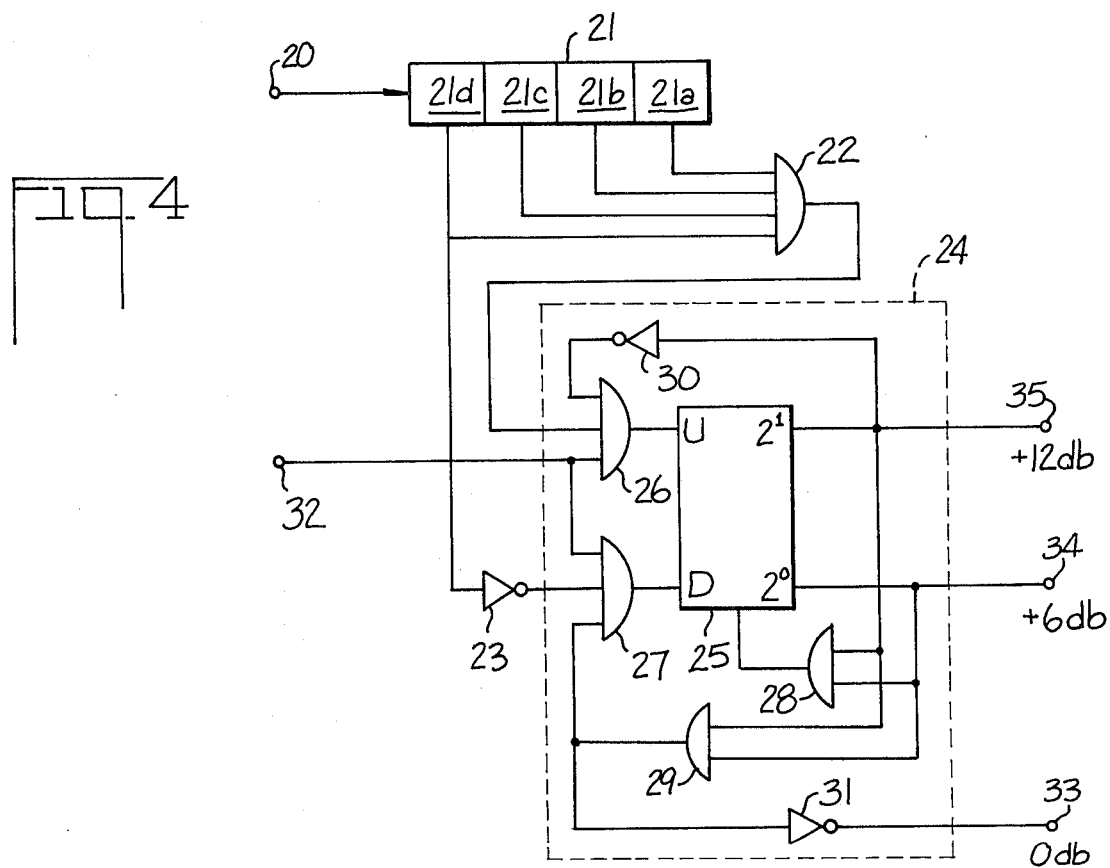
FIG. 4 is a schematic diagram of the control circuit section of the conversion apparatus illustrated in FIG. 2.

FIG. 1 shows the input-output characteristic of an analog-to-digital (A/D) converter capable of accepting a uni-polar analog signal, that is, an analog signal that varies in magnitude but not in polarity, and encoding it according to a four-bit digital code. The digital ouput signal scaled by a four-bit binary signal is plotted on the ordinate, and the analog input voltage is plotted along the abscissa. The analog input signal having a value between zero volts and $V_s$ volts is converted linearly to the corresponding uni-polar four-bit digital signal according to the magnitude of the input analog signal. As indicated by the horizontal line in the graph following the sloping section, analog signal values above $V_s$ volts are simply converted into a constant four-bit binary digital signal having a binary value 1111. Thus the analog voltage reaches a saturation value at the value $V_s$ of the A/D converter. This saturation value is also referred to as the full scale voltage. The graph illustrates another value which is utilized in the present invention and which is referred to as half-scale voltage.

In an A/D converter that operates according to the graph in FIG. 1, the digital code value 0000 corresponds to an analog input signal of 0 volts and the digital value 1000 is defined as the half-scale voltage $V_s/2$, although it is slightly larger than one-half the value $V_s$. The full scale voltage $V_s$ corresponds to the binary number 1111 in the digital signal. According to the input-output characteristic of the A/D converter, shown in FIG. 1, it is a simple matter to find out when the analog signal reaches the full scale voltage $V_s$ by detecting the existence of the binary code 1111. It is also a simple matter to determine when the analog signal is below the half-scale voltage by detecting the binary signal OXXX, in which the X's may correspond to either the 0's or the 1's. As is well known, each position in a binary multi-digit number has a weighting factor, and in the case of the binary signal 1000, the weighting factor of the 1 in the fourth position is $2^3$. The 1 in this position is referred to as the most significant bit (MSB) signal.

FIG. 2 shows a block diagram of the basic components of an A/D converter according to the present invention. The analog input signal is applied between an input terminal 1 and ground. These are the input terminals for an amplitude adjustment circuit 2 which, in this embodiment, is illustrated as a variable attenuator. The output of the attenuator is connected to a sample-and-hold circuit 3, and the output of the latter circuit is applied to an A/D converter 4 that encodes the analog signal information in digital form. The digital output signal from the A/D converter 4 is supplied to a control circuit 5 and to an output terminal 6.

The attenuator in the amplitude adjustment circuit 2 includes three resistors 8–10. Selected points along the attenuator are connected individually, but not simultaneously, to the sample-and-hold circuit 3 by three switching means 11–13, which are illustrated as if they were mechanical switches but which in fact are normally electronic switching circuits. The switching means 11 is connected to the top point 15 of the attenuator to receive the full analog voltage applied to the input terminal 1. The second switching means 12 is connected to a common circuit point 16 between the resistors 8 and 9 to receive an attenuated version of the input analog signal, attenuated by approximately 6db with respect to the full analog signal applied to the terminal 1. The third switching means 13 is connected to a common circuit point 17 between the resistors 9 and 10 to receive a further attenuated replica of the analog signal. The value of the analog signal at the circuit point 17 is attenuated approximately 12db with respect to the incoming signal at the terminal 15. The switching means 11–13 are individually and alternatively controlled by the control circuit 5 in response to a measured digital signal at the output of the A/D converter 4.

The operation of the circuit in FIG. 2 will be described in conjunction with the graph in FIG. 3. For values of analog signal applied to the terminal 1 and within the amplitude acceptable to the sample-and-hold circuit 3 and the A/D converter 4, the latter produces digital signals in a binary code and with a linear relationship between the binary numbers and the amplitude of the analog signal. This takes place in section (a) of the graph in FIG. 3 until the analog signal reaches an amplitude such as to cause the production of the digital signal 1111. This is the highest digital signal capable of being produced by the converter 4. The sample-and-hold circuit 3 does not transmit the analog signal in its original form but, in effect, transmits samples of it at a certain rate. The amplitude of each sample is the amplitude of the analog signal at the time the sample is taken, and the sample-and-hold circuit has the characteristic of being able to maintain an output voltage equal or substantially equal that value until the next sample is taken. Thus an analog signal that varies smoothly in amplitude is transformed by the sample-and-hold circuit into a waveform that somewhat resembles a staricase, although the rise between successive steps is not necessarily constant. This type of signal is effectively a pulse-amplitude modulation (PAM) signal, and it is really this PAM signal that is applied to the A/D converter 4. Within the interval between successive samplings of the original analog signal by the sample-and-hold circuit 3, the A/D converter 4 must produce a digital signal having a value that corresponds to the amplitude of the sample then being held by the sample-and-hold circuit.

The technique may be most clearly described by arbitrarily selecting a suitable analog signal waveform and set of voltage values. Let it be assumed that the waveform is a sawtooth wave that increases linearly with time and that it starts at zero value at time zero. Assume further that the rate at which it increases is one volt during each sampling interval. Such a signal would be transformed by the sample-and-hold circuit 3 into a true staircase signal having equal rise between successive level values. The level values would be one volt apart and thus it can be assumed that the digital signal at the output of the A/D converter 4 would have a waveform corresponding to the binary number system 1, 10, 11, 100, etc. as the analog voltage goes to the levels of 1v., 2v., 3v., 4v., etc.

When the analog voltage reaches the level of 15v., the digital signal reaches the value of 1111 and can go no higher. In accordance with the present invention, the 1111 signal at the output of the A/D converter 4 is recognized by a control circuit 5 and is applied to open the switching means 11 and close the switching means 12. This occurs at the end of the section (a) of the graph in FIG. 3. The values of the resistors 8–10 are selected so that the input analog signal to the terminal 1 is attenuated by approximately 6db at the terminal connected to the intermediate point 16.

As the analog voltage continues to increase along the line (b) in FIG. 3, which is simply equivalent to an attenuated extension of the section (a) of the graph, the attenuated voltage is sampled and held by the circuit 3 in the same manner as was done with the original part of the analog signal. However, instead of starting at zero, the attenuated voltage (b) starts at the level that corresponds to the digital signal 1000, which is approximately half of the maximum digital value of 1111. The attenuation of the analog signal by the amplitude setting circuit 2 in FIG. 2 is such that the amplitude of the analog signal does not drop below a value that would cause the A/D converter 4 to generate a digital signal of 1000. That is, it would not drop below a value that would keep the most significant bit (MSB) at the 1 level. This is a requirement of the system, because the existence of a 0 for the MSB is used, as will be explained hereinafter, as the signal to reset the circuit 2 to the next less attenuating level.

Each one volt increment in the attenuated signal as passed through the switching means 12 to the sample-and-hold circuit 3 now corresponds to a two volt increment in the actual analog signal applied to the input terminal 1. It is assumed in the numerical example being used to describe this invention that the binary number corresponding to the digital signal produced by the A/D converter 4 will change one unit only when the output voltage of the sample-and-hold circuit 3 changes by one volt. Since this happens only when the input signal to the terminal 1 increases by two volts, the A/D converter 4 will generate a different binary number only every second step of the staircase type signal produced by the sample-and-hold circuit 3 in section (b) of the graph in FIG. 3. This continues until the binary number corresponding to the digital signal produced by the A/D converter 4 again reaches the value 1111, which now corresponds to an analog voltage value twice as great as the analog voltage when the A/D converter 4 reached the value 1111 at the end of section (a) of the graph in FIG. 3.

The second time the A/D converter 4 reaches the value 1111 at the end of section (b) of the graph in FIG. 3, the control circuit 5 receives another signal that causes the switching means 12 to be opened and the switching means 13 to be closed. The values of the resistors 8–10 are selected so that this produces another 6db reduction in the amplitude of the output signal as applied to the sample-and-hold circuit 3. In FIG. 3, this corresponds to dropping from the peak value in section (b) of the graph to the lower end of section (c). As will be noticed, the attenuation of the analog signal again does not drop quite half way and does not drop below a level such that the reading of the A/D converter 4 at the beginning of section (c) of the graph in FIG. 3 would be 1000.

The A/D converter 4 can continue to generate a binary signal as indicated by section (c) of the graph in FIG. 3, but now the input analog signal to the terminal 1 must increase four volts for each unit change in the binary number corresponding to the output signal of the A/D converter 4. Since the attenuator shown in the amplitude setting circuit 2 has only three positions, when the amplitude of the analog signal applied to the terminal 1 reaches a value of 4 times the original full scale voltage at the end of section (a) of the graph in FIG. 3, the system may be said to be saturated, and still further increases in the amplitude of the voltage at the terminal 1 will not change the value of the digital signal derived from the A/D converter 4 from its value of 1111.

FIG. 4 shows in greater detail a schematic diagram of the control circuit 5 in FIG. 2. The circuit in FIG. 4 has an input terminal 20 connected to the sample-and-hold circuit 3 in FIG. 1. The input terminal is connected to the input of a four-bit shift-register 21 which has one section for each of the bits of the signal produced by the A/D converter 4. Each of these sections is connected to a separate input circuit of an AND circuit 22.

In addition, the MSB section is connected through an inverter 23 to a counter system 24. The AND circuit output may be referred to as the first circuit to control the counter system 24 and the inverter 23 may be referred to as the second circuit to control the counter system.

The counter system 24 comprises a reversible counter 25 that has UP and DOWN input terminals marked U and D, respectively, a resetting terminal R, and two output terminals marked $2^0$ and $2^1$, respectively. The output terminal of the AND gate 22 is not connected directly to the counter 25, but is connected to one input of another AND gate 26 which has its output terminal connected to the UP-count terminal of the counter. The output of the inverter 23 is connected to an input circuit of still another AND gate 27, the output terminal of which is connected to the DOWN-count terminal of the counter 25. The two output terminals of the counter 25 are connected to two input terminals of another AND gate 28, the output terminal of which is connected to the reset terminal (R) of the counter. The output terminals of the counter are also connected to input terminals of an OR gate 29, and the output terminal of the OR gate is connected to a second input terminal of the AND gate 27 and to an inverter 31. The $2^1$ output terminal of the counter 25 is connected through another inverter 30 to a second input terminal of the AND gate 26.

A timing signal is applied to an input terminal 32 that is connected to a third input terminal of the AND gate 26 and to a third input terminal of the AND gate 27, so that the counter system 24 may be controlled synchronously with the sampling signal in the sample-and-hold circuit 3 in FIG. 2. The $2^1$ output terminal of the counter 25 is also connected to a terminal 3 that controls the switching means 13 in FIG. 2. The $2^0$ output terminal of the counter 25 is connected to a terminal 34 that controls the switching means 12 in FIG. 2, and the output of the inverter 31 is connected to a terminal 35 that is connected in turn to the switching means 11 in FIG. 2. A 1 level signal condition at any one of the three output terminals 33–35 in FIG. 4 causes the switching means 11–13 to which these terminals are connected, respectively, to be closed. The operation of the circuit is such that only one of the output terminals 33–35 can be in the 1 condition at a time, and thus only one of the switching means 11–13 in FIG. 2 can be closed at any one time.

Figure 5:
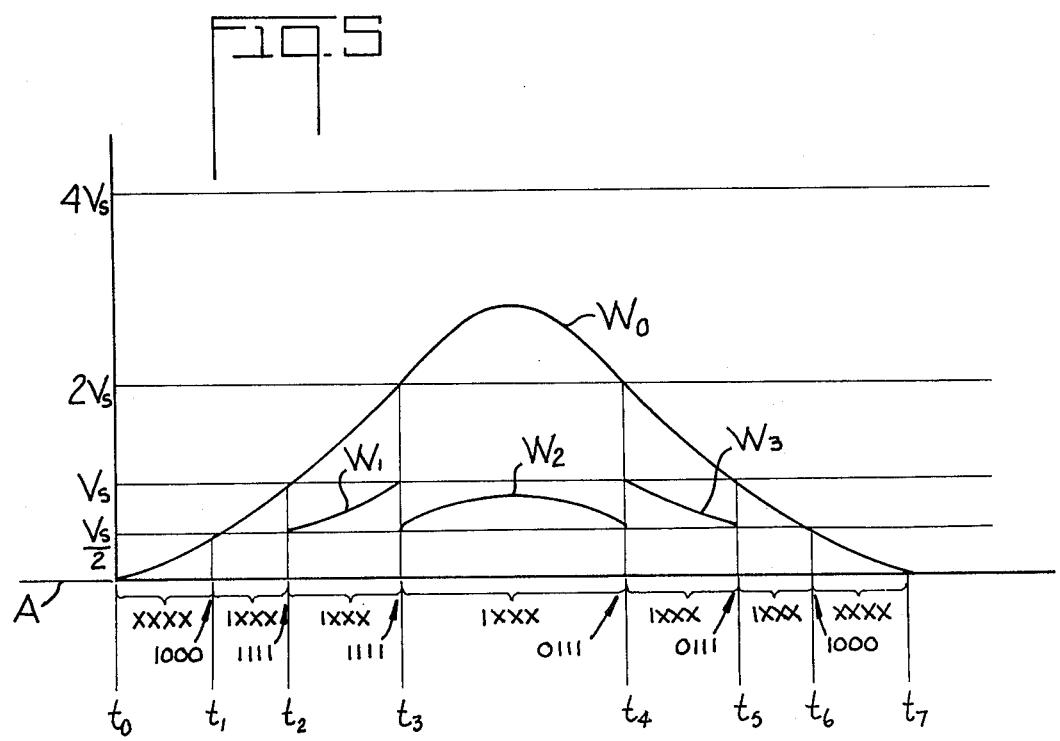
FIG. 5 is a graph illustrating the conversion of an analog signal to a digital signal in accordance with the present invention.

The operation of FIG. 4 will be described in conjunction with FIG. 2 and FIG. 5, which is a graph of an arbitrary analog signal $W_0$ that happens to start at zero volts at time $t_0$, increases to a maximum value that happens to be less than four times the voltage $V_S$ that is the normal maximum for this system, and then diminishes to zero at time $t_7$. The signal $W_0$ is considered to be a voltage applied to the input terminal 1 in FIG. 1.

The initial conditions in the circuit in FIG. 4 are that both of the terminals 34 and 35 are at the 0 level and the terminal 33 is at the 1 level, thus causing the switching means 12 and 13 to be open-circuited and switching means 11 to be closed. This means that both of the output terminals $2^0$ and $2^1$ of the counter 25 are at the 0 level, causing the output of the OR gate 29 to be 0. This value, applied to the inverter 31, produces an output level of 1 at the output of the inverter.

Between the times $t_0$ and $t_1$ the signal $W_0$ passes through the closed switching means 11 to the sample-and-hold circuit 3 and each sample is converted into a corresponding digital signal. The digital values during this time interval are indicated OXXX in which each of the X's can be either a 0 or a 1. The time $t_1$ is defined as the time at which the signal $W_0$ reaches a value that converts into the binary value 1000. As the binary numbers change in accordance with the changing value of the analog signal $W_0$ and are applied to the circuit 5 via the input terminal 20 in FIG. 4, the conditions in the four sections 21a–21d change from 0000 to 0001 to 0010, and so on to 1000 at the time $t_1$.

At any instant at least one of the four inputs to the AND gate 22 is 0, so the output of that gate is also 0. The input to the inverter 23 is 0 and therefore its output is 1 until the value 1000 is reached. At that time the input to the inverter becomes 1 and the output 0.

Between the time $t_1$ and $t_2$, the condition of the section 21d of the shift register always remains at the 1 level and eventually, at the time $t_2$, the signal $W_0$ converts into the digital value 1111. When that occurs, the output of the AND gate 22 will change to 1. Since the $2^1$ output terminal of the counter 25 was previously 0, the output of the inverter 30 was 1. When the sampling pulse signal, which is a 1 is applied to the terminal 32, all three of the inputs to the AND gate 26 will be 1, thus applying a 1 to the UP-count terminal of the counter 25.

The first 1 applied to the UP-count terminal to be memorized by the counter 25 reverses the condition of the $2^0$ output terminal to a 1 but does not change the condition of the $2^1$ output terminal. This makes the output terminal 34 rise to the 1 level and the output terminal of the OR gate 29 also change from 0 to 1. As a result the output of the inverter 31 drops to 0, and the switching means 11 becomes non-conductive. The switching means 12 becomes conductive due to the fact that terminal 34 is now at the 1 level, and the analog signal actually converted to digital form is attenuated 6db, or to ½ its real voltage. The attenuated signal $W_1$ is shown between the times $t_2$ and $t_3$, the latter being determined by the time the attenuated signal $W_1$ reaches the full scale voltage $V_S$ and is converted into a digital signal having the binary value 1111.

When the digital signal applied to the terminal reaches the value 1111, the shift register 21 applies a 1 level to all four of the terminals of the AND gate 22 to produce a 1 level at the output. The output of the inverter 30 is still 1, and when the sampling signal applied to the terminal 32 is also a 1, the AND gate 26 produces a 1 at its output and causes the counter 25 to count UP one more step. When this happen, the $2^0$ output terminal drops to 0, making the switching means 12 non-conductive, and the $2^1$ terminal rises to 1, making the switching means 13 conductive. As a result, the signal $W_0$ is attenuated to ¼ its original value, i.e. to the value $W_2$, following the time $t_3$.

The signal $W_0$ and its attenuated replica $W_2$ reach their peak values during the inverval $t_3$ to $t_4$. The time $t_4$ is defined as the time that the signal $W_2$ drops below the value that converts into a digital signal 1000, the lowest binary number that has a 1 as the MSB. When this happens, the input to the inverter 23 drops to 0 and its input rises to 1. One of the output terminals, in this case the $2^1$ terminal, of the counter 25 is at the 1 level, and so the output of the OR circuit remains at the 1 level. When the sampling signal applies a 1 signal, all of the inputs to the AND circuit are correct to apply a 1 signal to the DOWN-count terminal D of the counter 25. This causes the $2^1$ output terminal to apply a 0 to the terminal 35 and thus make the switching means 13 non-conductive, and it also causes the $2^0$ output terminal to apply a 1 signal to the terminal 34, making the switching means 12 conductive. As a result, the amplitude of the analog signal rises almost double, to the value $W_3$, from the time $t_4$ to the time $t_5$.

The time $t_5$ is defined as the time when the MSB of the digital equivalent of the analog signal $W_3$ reaches 0 and causes a further input to the DOWN-count terminal D of the counter 25. This returns the counter to its original value with a 0 at both the $2^0$ and $2^1$ output terminals, making both switching means 12 and 13 non-conductive, and, because of the inverter 31, causes the switching means 11 to receive a 1 and become conductive. This reduces the attenuation of the analog signal to 0db; i.e. the full value of the signal $W_0$ is converted after the time $t_5$.

At the time $t_6$, the value of the signal $W_0$ falls below $V_S/2$ and the corresponding digital signal falls below 1000, but due to the fact that the output of the OR gate 29 is 0, no signal can pass through the AND gate 27. Therefore, there is no further change in attenuation as the signal $W_0$ continues to decrease to zero at the time $t_7$.

Of course, the signal $W_0$ need not simply rise to a high peak value and descend to zero; it can, and normally will, vary back and forth. The greatest quantizing detail is obtained when the absolute value of the signal $W_0$ is below $V_S$, but the fact that the counter 25 can memorize two conditions corresponding to $V_S$ and $2V_S$ permits the analog signal $W_0$ to be quantized at lower sampling rates for higher peak voltages.

FIG. 6 shows a circuit that is the converse of the circuit in FIG. 2 and is used to reconstruct an analog signal from the digital signal at the output terminal 6 in FIG. 2. An input terminal 41 in FIG. 6 is connected by any type of link — wire, wireless, computer, recorder, etc. — to the terminal 6 in FIG. 2. The digital signal is applied to a shift register 42 that supplies multi-digit output signals to a digit-to-analog (D/A) converter 43 and to a control circuit 44. The D/A converter 43 is connected to an amplitude selection circuit 46 that comprises, in this embodiment, an attenuator and three switching means 47–49 connected to an output terminal 50. The attenuator comprises three resistors 51–53 related in the same way as the resistors 8–10, respectively, in the amplitude selection circuit in FIG. 2 to produce attenuation values of 0db, 6db, and 12db at three points 54–56 along the attenuator.

FIG. 7 is a schematic diagram of an embodiment of the control circuit 44 in FIG. 6. It need not be described in detail since it is quite similar to the circuit in FIG. 4. Circuit elements in FIG. 7 that correspond to those in FIG. 4 are identified by the same reference number followed by the letter a.

The AND circuit 22a has four input terminals 57–60 connected to the sections of the shift register 42 in FIG. 6. The terminal 60 is connected to the MSB section of the register 42 and is connected to the inverter 23a.

The output terminals 62–64 are connected to control the switching means 47–49 of FIG. 6 inversely with respect to the way the output terminals 33–35 of FIG. 4 control the switching means 11–13 in FIG. 2. That is, the terminal 64 in FIG. 7 controls the switching means 49 in FIG. 6 for 12db attenuation, the terminal 63 controls the switching means 48 for 6db attenuation and the terminal 62 controls the switching means 47 for 0db attenuation.

The operation of the circuits in FIGS. 6 and 7 will be described with relation to the reconstruction of the analog signal $W_0$ in FIG. 5. From the time $t_0$ to the time $t_2$ the digital signals increase from 0000 to 1111 and are converted by the D/A converter 43 into the analog signal $W_0$. Since this portion of the signal is the low-amplitude portion, and since the actual amplitude of the output amplitude of the output signal of the D/A converter must be great enough to reproduce the expanded analog signal, the low-amplitude portion is obtained at the output terminal 50 by attenuating the actual output signal voltage of the D/A converter 43 by 1:4, or 12db. Thus, when the digital signal is between 0000 and 1111, the switching means 49 is closed by a 1 level at the output terminal 64 and the other switching means 47 and 48 are held open by 0 level signals at the terminals 62 and 63.

Once the digital signal applied to the terminals 57–60 reaches 1111 and a sampling pulse applies a 1 level signal to the terminal 32$a$, the counter 25$a$ is stepped to the second level and memorizes that level. In the second level the terminal 63 has a 1 level signal while the terminals 62 and 64 have 0 level signals. Thus the actual output signal of the D/A converter 43 is attenuated only 2:1, or 6db, as long as the digital signal does not drop below 1000 or rise to 1111. Under such conditions, which exist from the time $t_2$ in FIG. 5 to the time $t_3$, the second segment of the signal $W_0$ is reproduced at the output terminal 50.

The counter 25$a$ memorizes this condition either until the digital signal applied to the shift register drops below 1000 so that the MSB applied to the input terminal drops from 1 to 0, or, as actually happens in reconstructing the signal $W_0$, until the signal applied to the shift register 42 reaches the value 1111. In that case, the counter 25$a$ steps up and produces an output 1 at the terminal 62 and a 0 at the terminal 63. There is also a 0 at the terminal 64. This condition continues from the time $t_3$ to the time $t_4$, and during that interval the amplitude selection circuit 46 passes the analog signal without attenuation from the D/A converter 43 to the output terminal 50.

At the time $t_4$ the MSB of the digital signal drops from 1 to 0 and, as a result, a 1 signal is applied to the DOWN-count terminal of the counter 25$a$. This causes the counter to count down to the condition in which the output terminal 62 is at the 0 level and the output terminal 63 is at the 1 level.

At the time $t_5$ the digital signal applied to the shift register again drops below the binary number 1000 so that the counter 25$a$ receives another signal to count down. This changes the level of the output terminal 63 to 0, which is the same as the level of the output terminal 62. The output terminal 64 rises to the 1 level. Thus, from the time $t_5$ to the time $t_7$ the output signal of the D/A converter 43 is attenuated 12db to reconstruct the low-amplitude segment of the signal $W_0$.

While the invention has been described in connection with two-level counter circuits and four-bit converters and three-level attenuators for the amplitude selection, or adjustment, circuits, it should be understood that the counters and attenuators could be more complex to allow a compression of the analog signal in more steps and a commitant expansion of the reconstructed signal. Or the counters could be simpler for only two-level compression. Moreover, the amplitude selection circuits could be amplifiers instead of attenuators. In any case, the relative compression level for encoding must not drop the binary value of the converted signal to a level such as to actuate the DOWN-count circuit, which, in the embodiment shown, is by the simple recognition of a 0 in the MSB. Thus, a voltage change of 2:1, or 6db, is optimum.

What is claimed is:

1. In a signal transformation system for converting between a first type of signal and a corresponding value of a second type of signal, one of said types being an analog signal and the other of said types being a digital signal within a range of values between zero and a miximum value, apparatus comprising:
   A. amplitude adjustment means for adjusting the amplitude of said analog signal, said means having at least first and second settings, the output amplitude of said analog signal from said adjustment means being greater in said first setting than in said second setting by a predetermined ratio; and
   B. control means comprising:
      1. a multi-section digit register to receive said digital signals,
      2. a first circuit comprising an AND gate connected to said digit register to respond to a "1" condition in all sections of said register, and
      3. an up-down counter to memorize first and second count conditions, said counter being connected to said AND circuit and connected to said amplitude adjustment means to set said amplitude adjustment means to said second setting in response to a 1 signal from said AND circuit and to respond to change of the most significant bit of the digital signal from 1 to 0 to set said amplitude adjustment means from said second setting to said first setting.

2. The system of claim 1 in which said counter comprises an UP count input terminal and said AND circuit is connected thereto and further comprises a DOWN counter input terminal, said control circuit further comprising a second circuit connecting the most significant bit section of said register to said DOWN COUNT input terminal to cause said counter to reset said amplitude adjustment means to said first setting in response to a 0 condition in said most significant bet section.

3. The system of claim 2 in which said amplitude adjustment means comprises:
   A. first switching means connected to said control means to be closed only when said counter is in its first count condition to set said amplitude adjustment means to said first setting; and
   B. second switching means to said control means to be closed only when said counter is in its second count condition to set said amplitude adjustment means to said second setting.

4. The system of claim 2 in which said amplitude adjustment means comprises:
   A. an attenuator comprising a main output terminal, and first and second level-setting terminals; and
   B. switching means connected to said control means to be actuated thereby to connect either of said first or second level-setting terminals, selectively, to said output terminal.

5. The system of claim 2 in which said second circuit is connected to said counter to be enabled when said counter is in said second count condition to cause said counter to return to said first count condition when the most significant bit of said digital signal drops from 1 to 0.

6. The system of claim 5 in which said counter comprises first and second output terminals, and said second circuit comprises:
   A. an inverter;
   B. a second AND gate connected to said inverter to receive a 1 signal therefrom when said most significant bit signal is 0; and
   C. an OR gate connected to said counter output terminals to receive signals therefrom and having an output terminal connected to said second AND gate to supply a 1 signal thereto when either of said counter output terminals has a 1 level, said second AND gate having an output terminal connected to said DOWN-count terminal of said counter.

7. The system of claim 6 in which said control circuit further comprises:
   A. a third AND gate having a first input terminal connected to an output terminal of said first-named AND gate; and
   B. a second inverter having an input terminal connected to said first counter output terminal and an output terminal connected to an input terminal of said third AND gate, the output terminal of said third AND gate being connected to said UP-count input terminal of said counter to cause said counter to count up only when said first counter output terminal is at 0 level.

8. The system of claim 7 comprising, in addition, a third inverter having an input terminal connected to said first counter output terminal and having an output terminal.

9. The system of claim 1 comprising, in addition:
   A. a sample-and-hold circuit to receive said analog signal; and
   B. an analog-to-digital converter connected to said sample-and-hold circuit to convert the output signal thereof into a digital signal, said amplitude adjustment means comprising an attenuator to have said analog signal applied thereto and comprising a plurality of attenuation levels aproximately 6db apart.

10. The system of claim 9 comprising, in addition:
    A. a shift register
    B. a digital-to-analog converter connected to said shift register to convert digital signals therefrom into analog signals;
    C. second amplitude adjustment means connected to the output of said digital-to-analog converter and having the same number of attenuation levels as said first-named amplitude adjustment means; and
    D. second control means connected to said shift register to be controlled by said first value of said digital signal therefrom to set said second amplitude adjustment means to said levels inversely with respect to the setting of said first-named amplitude adjustment means by said first-named control means.

11. The system of claim 1 comprising, in addition:
    A. a shift register to receive said digital signals; and
    B. a digital-to-analog converter connected to said shift register to receive said digital signals therefrom, said amplitude adjustment means being connected to the output of said digital-to-analog converter to set the level of analog signals therefrom.

* * * * *